United States Patent [19]
Ono et al.

[11] Patent Number: 5,343,047
[45] Date of Patent: Aug. 30, 1994

[54] ION IMPLANTATION SYSTEM

[75] Inventors: Hiroo Ono; Shuji Kikuchi, both of Yamanashi; Masayuki Tomoyasu, Nirasaki; Naoki Takayama, Kofu; Riki Tomoyoshi, Nirasaki, all of Japan

[73] Assignee: Tokyo Electron Limited, Tokyo, Japan

[21] Appl. No.: 82,454

[22] Filed: Jun. 25, 1993

[30] Foreign Application Priority Data

Jun. 27, 1992 [JP] Japan ................................ 4-193352
Jun. 29, 1992 [JP] Japan ................................ 4-196474
Jun. 29, 1992 [JP] Japan ................................ 4-196475

[51] Int. Cl.$^5$ ............................................ H01J 37/317
[52] U.S. Cl. ............................. 250/492.21; 250/251; 250/398
[58] Field of Search ............... 250/492.21, 398, 251

[56] References Cited

U.S. PATENT DOCUMENTS 5,089,710 2/1992 Kikuchi et al. .
5,148,034 9/1992 Koike .

Primary Examiner—Jack I. Berman
Attorney, Agent, or Firm—Oblon, Spivak, McClelland, Maier & Neustadt

[57] ABSTRACT

A system for implanting ions into a semiconductor wafer includes an ion source device, a mass spectrometer, an accelerating tube and a process chamber arranged in this order. A rotating disk is arranged in the process chamber to support a plurality of wafers thereon. A Faraday cup is arranged in the process chamber, corresponding to an ion beam shooting position. The Faraday cup serves to shut up therein secondary electrons and ions generated from the wafer at the time of ion implantation for measuring the amount of ions implanted. A suppressor electrode is provided to suppress the flow-out of the secondary electrons from the Faraday cup. The suppressor electrode comprises a cylindrical body made of carbon and an SiC film formed on the inner face of the cylindrical body. The SiC film serves as a resistance of the electrode surface for preventing rapid discharge from being caused at the electrode surface.

19 Claims, 7 Drawing Sheets

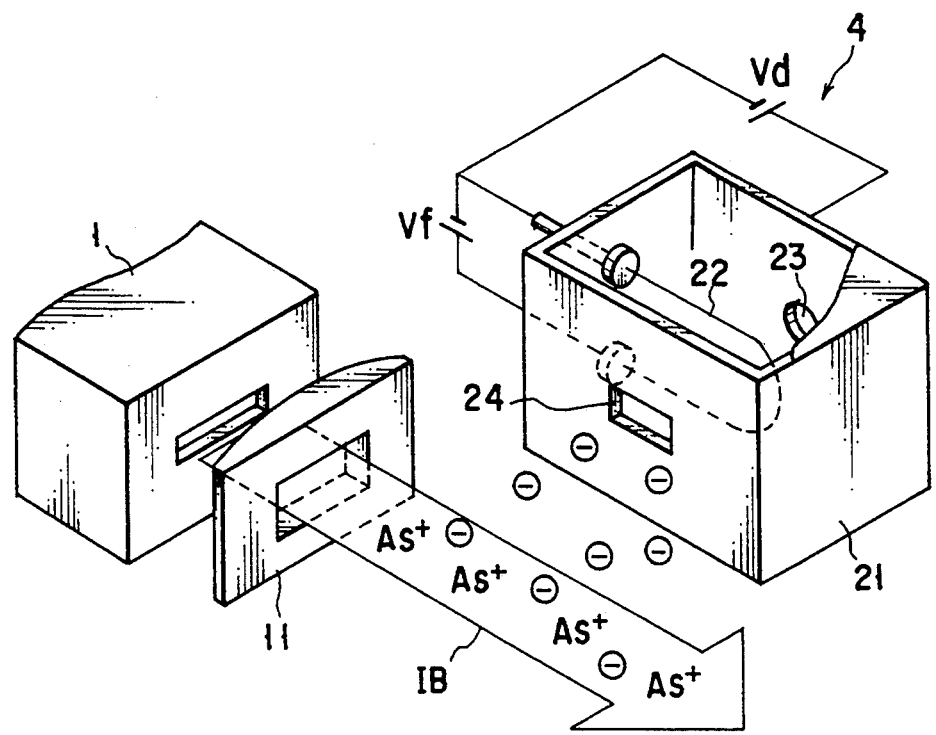
FIG. 5
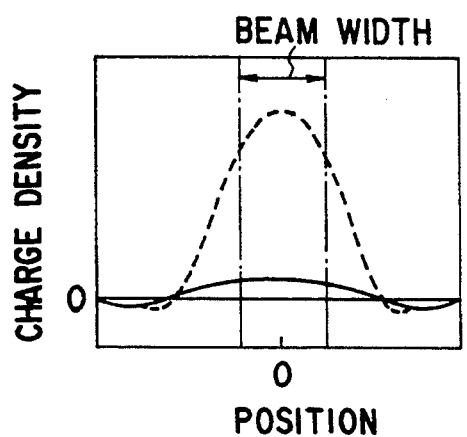 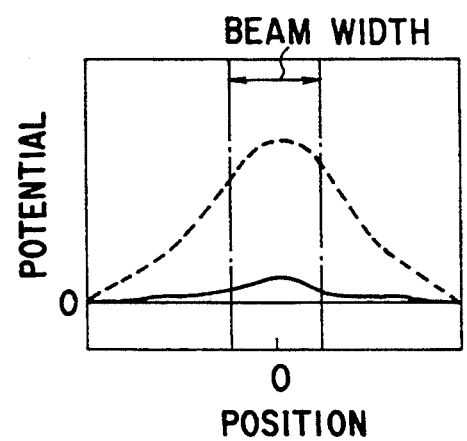
FIG. 6　　　　　　FIG. 7

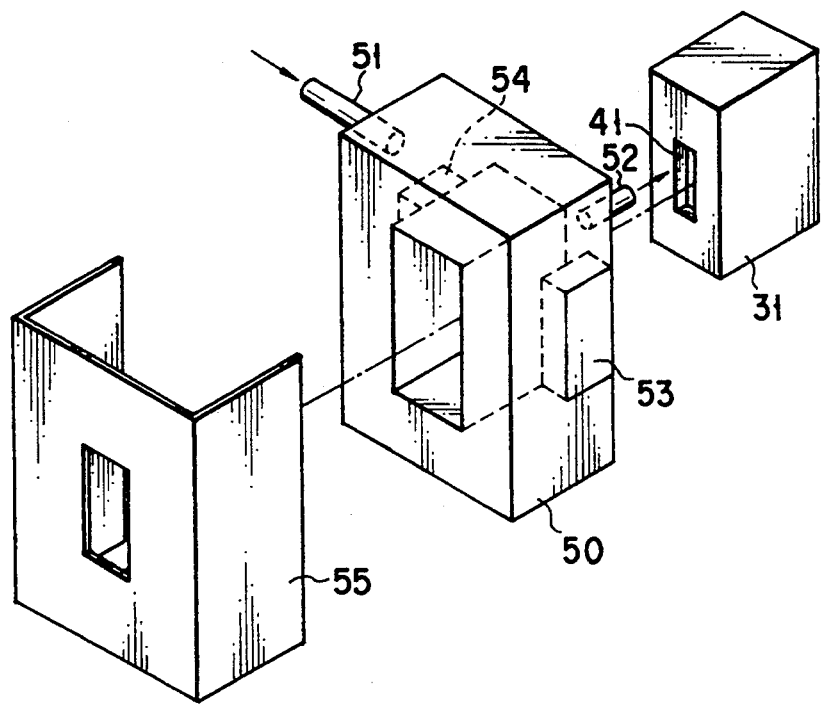
F I G. 14
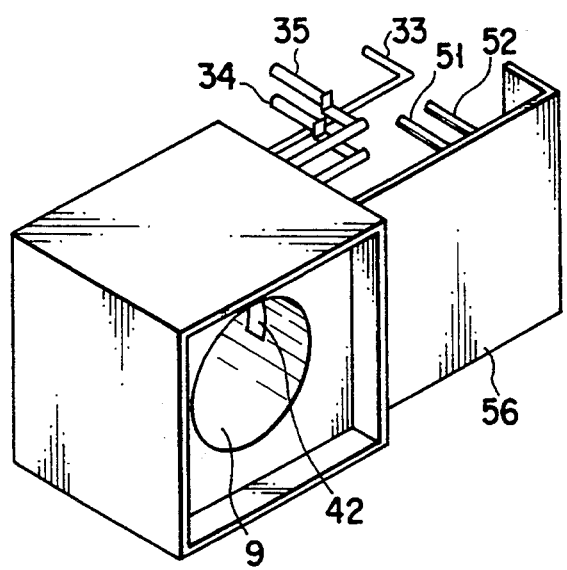
F I G. 15

ION IMPLANTATION SYSTEM

BACKGROUND OF THE INVENTION

1. Field of the Invention

The present invention relates to an ion implantation system and more particularly, an improvement of the suppressor electrode for the Faraday cup.

2. Description of the Related Art

The ion implantation technique is a manner of accelerating impurity ions generated in the ion source device by high electric field and introducing impurities into an object such as the semiconductor wafer, which is to be processed, while using the kinetic energy of the impurity ions accelerated. This manner is quite effective in that the total of the impurities introduced into the object can be accurately measured as an amount of charges.

The structure of a typical ion implantation system for implanting impurities into the semiconductor wafer is as shown in FIG. 1. According to the typical ion implantation system having such structure as shown in FIG. 1, materials such as gases are made into plasma in an ion source device 90, and desired positive ions are drawn out from this plasma, accelerated and then shot or radiated to a wafer W. Positive ions in the plasma are electrically drawn out by an extraction electrode 91 and spectroscopically analyzed by a mass spectrometer 92 to separate the above-mentioned positive ions from the positive ions thus drawn out. Further, this ion separation is completely carried out by a separation slit 93 and the desired positive ions thus separated are accelerated to final energy through an accelerating tube 94.

A Faraday cup 95 is located just before the wafer W to shut up therein secondary electrons and ions generated when ions are implanted into the surface of the wafer W not to cause them to flow out and to accurately measure the amount of ions implanted. A suppressor electrode 96 is further located before an inlet of the cup 95 not to cause the secondary electrons to come out of the cup 95. Voltage of −2 KV, for example, is added from a power source E to the suppressor electrode 96. A plasma generating chamber 97 is located on one side of the cup 95 to neutralize positive charges stored on the surface of the wafer at the time when ion beam is shot to the wafer.

The ion implantation system having the above-described structure is disclosed in U.S. Pat. Nos. 5,089,710 and 5,148,039, for example.

In the case of this ion implantation system, an insulating film such as $SiO_2$, $Al_2O_3$, $P_2O_5$ or $As_2O_3$, which is a byproduct created at the ion implantation process, is formed on the surface of the suppressor electrode 96 as the suppressor electrode 96 is repeatedly used. In addition, charged particles included in plasma generated in the plasma generating chamber 97 or caused when the ion beam collides with remaining gases are present in the vicinity of the electrode 96. Positive charged particles of them are attracted by the suppressor electrode 96. Because of the action of the above-mentioned insulating films formed on the surface of the electrode 96, however, the positive charged particles are not taken into the electrode 96 but stored on the top of the insulating films.

FIG. 2 schematically shows the state of the positive charged particles stored, together with an equivalent circuit. Symbols DI, C and V in FIG. 2 represent the layer of insulating films, the capacity of the insulating films, and suppressing voltage, respectively. When ion beam is shot to the surface of the wafer W, the wafer itself, a wafer supporting disk made of aluminum and a photo-resist film formed on the wafer W are sputtered by the ion beam. Particles thus generated by sputtering are scattered, combined with ions to be implanted and stuck to and stored on the surface of the suppressor electrode 96. It is supposed that the insulating film layer DI is formed on the surface of the suppressor electrode 96 in this manner.

When the amount of charges of the positive charged particles stored on the surface of the suppressor electrode 96 exceeds the break down voltage of the insulating film layer DI, discharge is caused between the surface of the insulating film layer DI and the electrode 96 and current is thus allowed to rapidly flow to this discharge-caused part. Because the electrode 96 is a conductor, electrons which correspond to the current are supplied from the voltage source E to the part and large instant heat energy is thus caused there by the discharge. As the result, a part of the insulating film layer DI on the electrode 96 is scattered like a burst together with a part of the electrode 96 by the impact of the discharge, as shown in FIG. 3, and particles are thus caused.

Further, semiconductor devices are more and more highly integrated and those cases where impurities must be implanted into the wafer only by an extremely small depth are therefore increased. According to the conventional ion implantation system, voltage in the accelerating tube 94 is set, in these cases, reverse to that at the time of acceleration to decelerate the ion beam. According to this manner, however, the depth into which impurities are implanted cannot be made uniform. Needs asked by the devices are still left not satisfied accordingly.

Still further, vapor of a matter such as tungsten of which the filament is made and particles caused when a matter such as molybdenum of which inner walls of the plasma generating chamber 97 are made is sputtered by plasma are present, although quite small in amount, in the plasma generating chamber 97. Atoms of these heavy metals fly out outside the chamber 97 to thereby contaminate the surface of the wafer W.

SUMMARY OF THE INVENTION

The object of the present invention is therefore to provide an ion implantation system capable of suppressing the generation of particles from the above-mentioned suppressor electrode and those from which particles are caused as seen in the case of the suppressor electrode.

According to an aspect of the present invention, there can be provided a system for implanting ions into an object to be processed in vacuum atmosphere, comprising: support means for supporting the object; an ion source device for generating plasma in which ions to be used are included; means for extracting the ions, as an ion beam, from the plasma; guide means for accelerating and shooting the ion beam to the object supported by the support means; a Faraday cup located adjacent to the support means to enclose the object for measuring the amount of ions implanted on the basis of secondary electrons generated from the object at the time of ion implantation; a suppressor electrode for suppressing the flow-out of the secondary electrons from the Faraday cup and having a main surface exposed to the secondary electrons and made of a high resistant conductive material whose resistance value is in a range of $10^{-2}$ $\Omega cm$–$10^5 \Omega cm$; and a power source for adding negative potential to the suppressor electrode.

When charged particles having charges reverse to the potential of the electrode are drawn to the electrode and insulating films are formed on the surface of the electrode, the charges or positive ones are stored on the top of the insulating films. When the amount of the positive charges exceeds the break down voltage of the insulating films, discharge is caused at this part and current is caused to rapidly flow to the part. When at least the surface of the electrode is made of a high resistance conductive matter, however, the flow of the current is suppressed by the resistance of this conductive material and the peak value of the current is made small. Damages added to the insulating films and the electrode because of discharge are thus suppressed to make small the amount of particles thus caused.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a perspective view showing a plasma generating device for adding electrons to ion beam;

FIGS. 6 and 7 are graphs intended to explain the operation of electrons added to ion beam;

FIG. 14 is a perspective view showing the plasma generating device in FIG. 12 dismantled; and FIG. 15 is a perspective view showing the Faraday cup in FIG. 12.

DETAILED DESCRIPTION OF THE PREFERRED EMBODIMENT

Figure 4:
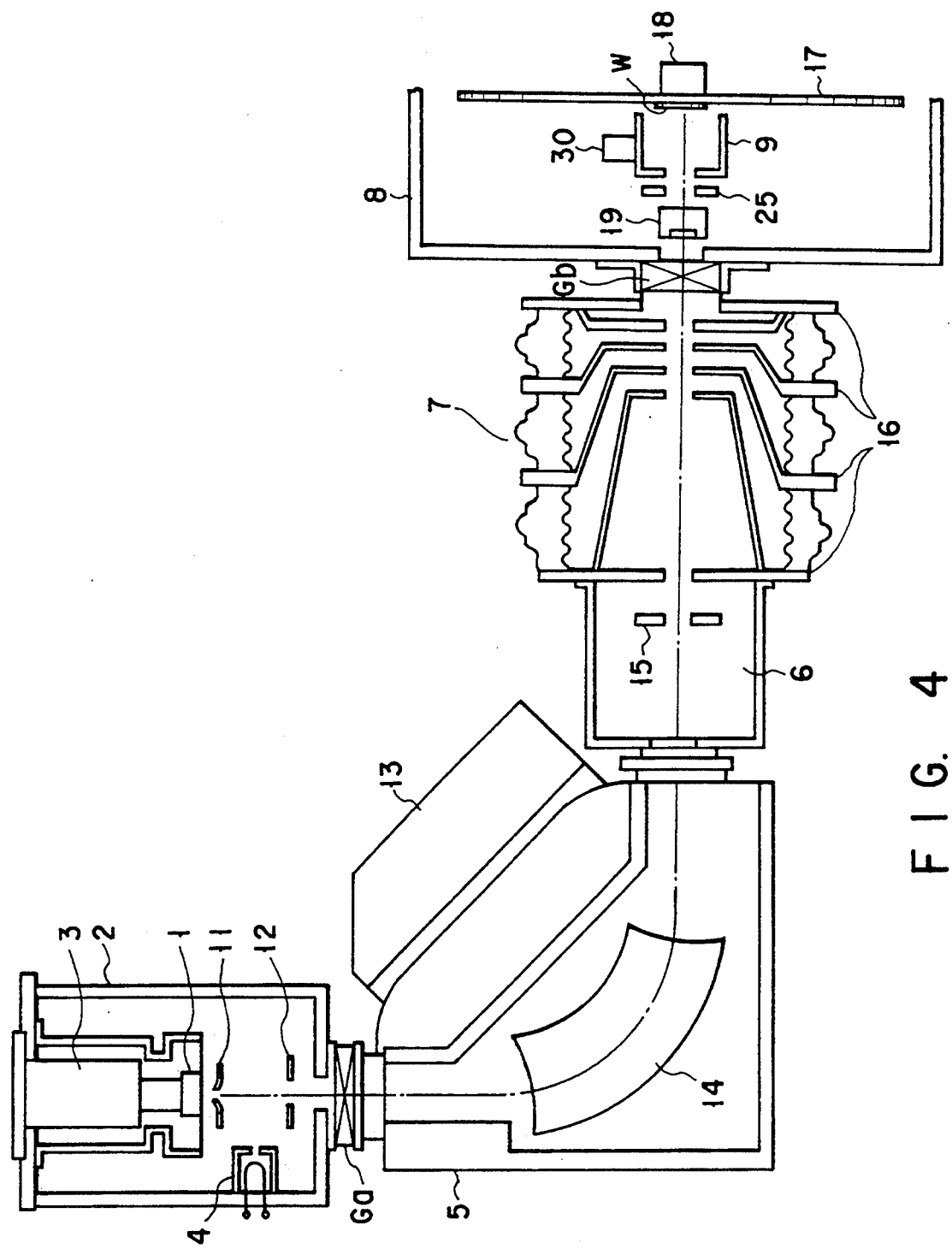
FIG. 4 shows the whole of the ion implantation system according to an embodiment of the present invention.

FIG. 4 shows the whole of the ion implantation system according to an embodiment of the present invention. A vaporizer 3 is arranged in a first vacuum chamber 2 to serve as a support for an ion source device 1. The vaporizer is detachably attached to the first vacuum chamber 2. The vaporizer 3 and a gas source (not shown) are connected to a plasma chamber in the ion source device 1. The vaporizer 3 stores solid material therein to sublimate it into impurity components by heating means and the gas source stores gas material therein. Solid and gas materials are selectively used.

A device of the Freeman type or of the electron exciting type is used as the ion source device 1. The former is intended to make raw material directly into plasma while adding voltage between a rod-like filament, for example, and an anode electrode. The latter is intended to make inactive gas into plasma and cause electrons drawn out of this plasma to collide with raw gas to make it into plasma. Ion extraction electrode 11 are arranged in front of the outlet of the ion source device 1 and voltage is added between the electrode 11 and the body of the ion source device 1 to draw, as a beam, positive ions out of plasma. One of the ion source devices which can be used in the present invention is disclosed in U.S. patent application Ser. No. 08/025,132 filed Mar. 2, 1993, the teachings of which are hereby incorporated by reference.

A variable slit section 12 which can change the width of its slit is arranged downstream of the extraction electrode 11. A plasma generating device 4 is arranged between the extraction electrode 11 and the slit section 12, facing the passage of ion beam formed between the electrode 11 and the slit section 12. As shown in FIG. 5, the plasma generating device 4 includes a plasma generating chamber 21 made of molybdenum, for example, and a filament 22 made of tungsten and arranged in the plasma generating chamber 21. A DC power source of voltage $Vf$ is connected to both ends of the filament 22. Another DC power source of voltage $Vd$ is also connected to the filament 22 and a side wall of the chamber 21. The chamber 21 has an opening 23 through which discharge gas such as argon, xenon and krypton is introduced into the chamber 21. The chamber 21 also has an opening 24 through which electrons are drawn out of plasma generated by the discharge of discharge gas.

A mass spectrometer 5, a second vacuum chamber 6, an accelerator tube 7 and a vacuum process chamber 8 are arranged in this order downstream the first vacuum chamber 2. When ions are being implanted, this line beginning with the first vacuum chamber 2 and ending with the process chamber 8 is kept under vacuum atmosphere. The first and second vacuum chambers 2 and 6 and the process chamber 8, however, can also control their inner pressures independently of the others. A gate valve Ga is arranged between the first vacuum chamber 2 and the mass spectrometer 5 and another gate valve Gb between the accelerator tube 7 and the process chamber 8 for this purpose. Inner pressures of the mass spectrometer 5 and the accelerator tube 7 are controlled by the second vacuum chamber 6.

The mass spectrometer 5 bends the orbit of ion beam in a bending tube 14 by means of a mass spectrometric magnet 13 to pick up only desired ions, using the fact that ions are bent depending upon their own masses. Ions whose masses are alike to each other are sometimes mixed in the spectroscopically-analyzed ion beam. In order to exclude ions from needed ones, therefore, a separating slit section 15 is arranged in the second vacuum chamber 6. The accelerator tube 7 serves to add accelerating voltage to the ion beam to accelerate it. Plural electrodes 16 are provided for this purpose and accelerating voltage is added to them.

A rotating disk 17 along the outer rim portion of which a plurality of wafers W are arranged is housed in the vacuum process chamber 8. The disk 17 can be rotated in a speed as high as 1000 rpm by a horizontal shaft 18 to implant ions into the wafers W supported on the disk 17. A Faraday cup 9 is arranged in the process chamber 8, opposing to the disk 17 and enclosing the ion beam. A beam gate 19 is arranged between the gate valve Gb and the cup 9 to control the shooting and shielding of ion beam.

The Faraday cup 9 is used to hold secondary electrons generated at the time of ion implantation therein not to allow them to come outside it but to accurately measure the amount of ions implanted. It is shaped like a cylinder or rectangular casing enclosing that area of ion beam which is just in front of the wafer, and it is made of conductive matter such as aluminium.

Figure 8:
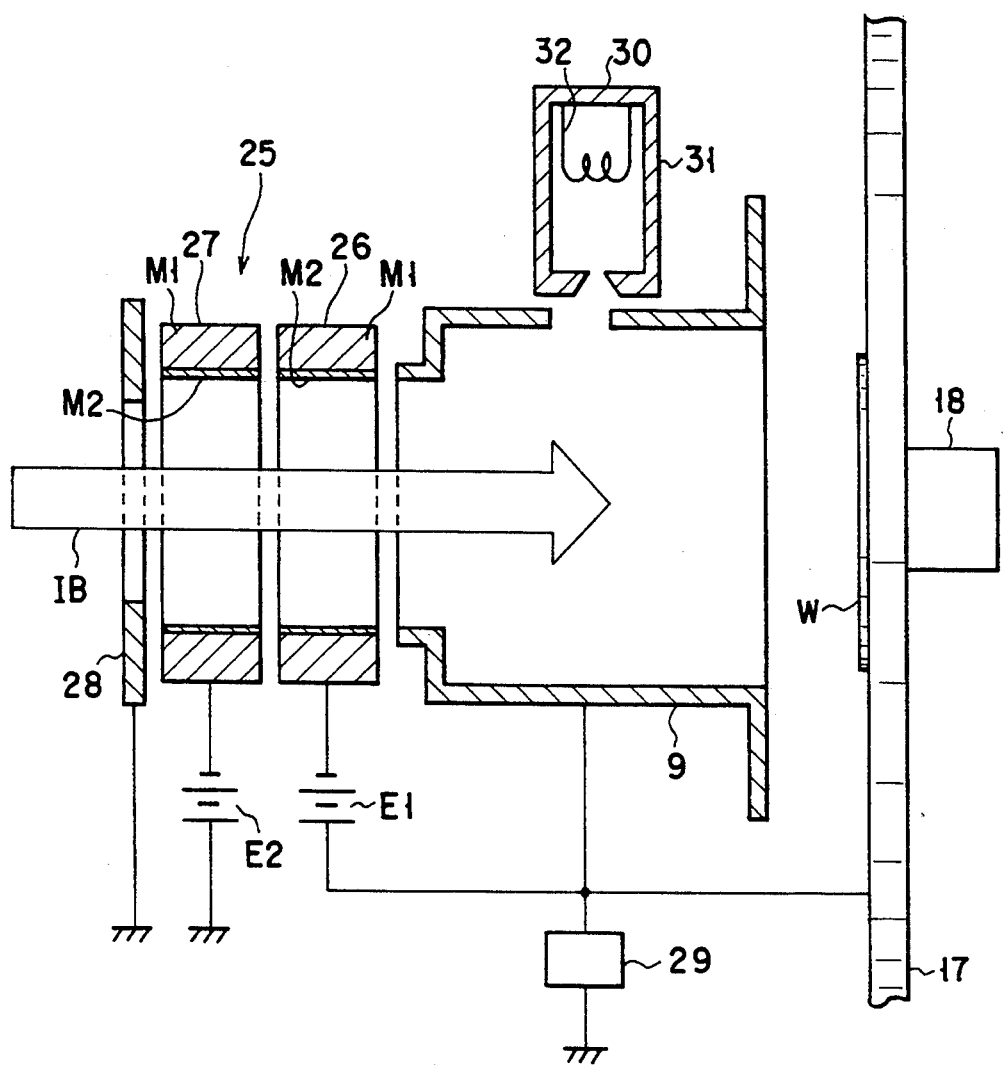
FIG. 8 is a sectional view showing a Faraday cup and its vicinity of the system according to the present invention.
Figure 9:
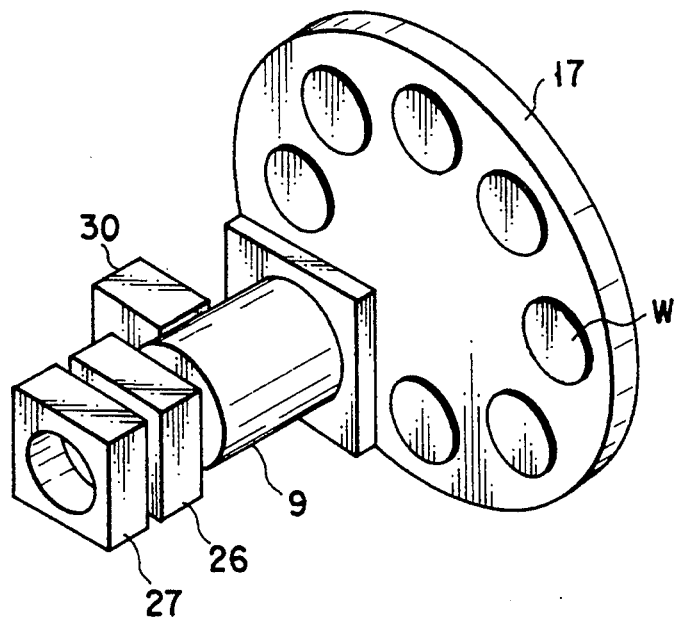
FIG. 9 is a perspective view showing the Faraday cup and its vicinity of the system shown in FIG. 8.

As shown in FIGS. 8 and 9, a suppressor electrode 25 is located on the inlet side of the Faraday cup 9. A ring-shaped ground aperture 28 which serves to focus the ion beam is located adjacent to and upstream the suppressor electrode 25.

The suppressor electrode 25 comprises two cylindrical electrode elements 26 and 27 each having a circular inner face. Suppressing voltage of −2 kV is added between the electrode element 26 and the ground and between the electrode element 27 and the ground by power sources E1 and E2. The positive terminal of the power sources E1 connected to the electrode element 26 located downstream (or right in FIG. 8) is connected to a current measuring line, which extends from the Faraday cup 9 and the rotating disk 17, and earthed via a detector section 29 which detects the dose amount (or beam current at one time ion implanting process).

When the wafers W are shot by ion beam IB and their surface energy becomes high, secondary electrons fly out of the wafer surfaces. If secondary electrons fly out outside the Faraday cup 9, positive charges corresponding to these fly-out electrons are counted to thereby make it impossible to accurately measure the amount of ions implanted. Where the suppressor electrode 25 is provided, however, the fly-out electrons are shut by the suppressor electrode 25 to thereby suppress the flying-out of electrons outside the Faraday cup 9.

Each of the electrode elements 26 and 27 comprises a cylindrical body M1 made of low resistant conductive material, such as carbon and aluminium, and a protection film M2 made of high resistant conductive material (including semiconductor), such as an SiC film having a thickness of 100 $\mu$m and formed on the inner face of the cylindrical body M1. The protection film M2 is used as a resistance and its resistant value is set in a range of $10^{-2}$ $\Omega$cm–$10^5$ $\Omega$cm. Other semiconductors, such as Si, can be used instead of SiC as the material of which the protection film M2 is made. Further materials, such as a mixture of conductive and insulating matters, can be used as the material of the protection film M2. As an example of these material, there can be cited ceramics resulted from the chemical reaction of BN and $TiB_2$ and the resistant value of this ceramics can be adjusted by changing the mixing rate of BN and $TiB_2$. This ceramics is available, with a trade name of "BN Composite EC", from Denkikagakukougyou Kabushiki Kaisha.

A plasma generating device 30 comprising a plasma generating chamber 31 and a filament 32 is connected to a side of the Faraday cup 9. The plasma generating device 30 is used to supply those electrons with which positive charges stored on the surfaces of the wafers W when the wafers W are shot by the ion beam are neutralized.

The plasma generating chamber 31 is made of carbon or molybdenum and the filament 32 is made of tungsten, for example. A gas supply pipe 33 extending to argon, xenon or krypton gas sources (not shown) is connected to a side wall of the chamber 31. That side wall of the chamber 31 which is directed to the Faraday cup 9 is provided with an opening 41 through which plasma in the chamber 31 can flow into the cup 9. The width of each of inner traverse rims of the opening 41 is about 1 mm and the opening 41 becomes larger as it comes nearer its outer rims.

Figure 13:
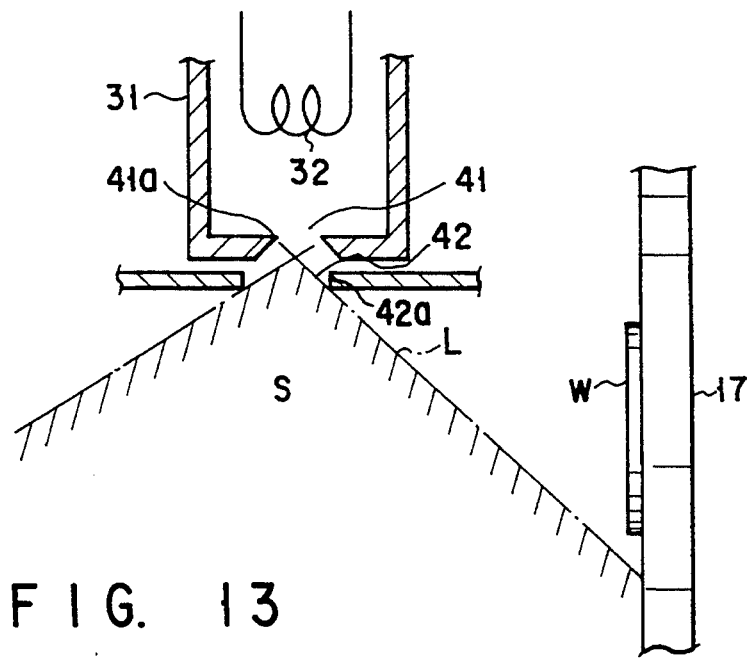
FIG. 13 is a sectional view intended to explain the operation of the plasma generating device shown in FIG. 12.

That side wall of the cup 9 which is opposed to the opening 41 of the chamber 31 is provided with an opening 42. That side wall of the cup 9 by which the opening 42 is defined serves to interrupt any line of sight connecting a point in the chamber 31 and a point on wafers mounted on the disk 17. In other words, the openings 41 and 42 or plasma outlets are designed in such a way that no wafer is present in a scope S defined by lines of sight shot outside from the chamber 31, as shown in FIG. 13. For this, it is set that a straight line L connecting a left inner rim or side 41a of the opening 41 and a right inner rim or side 42a of the opening 42 is diverted from the wafers W.

Power supply members 34 and 35, each being a combination of a terminal, a power supply plate, and a rod, are connected to both ends of the filament 32. A power source of filament voltage Ef is connected to members 34 and 35. A power source of discharge voltage Ed is connected to the filament 32 and a side wall of the chamber 31. The plasma generating device 30 may use high frequency instead of the filament.

Figure 12:
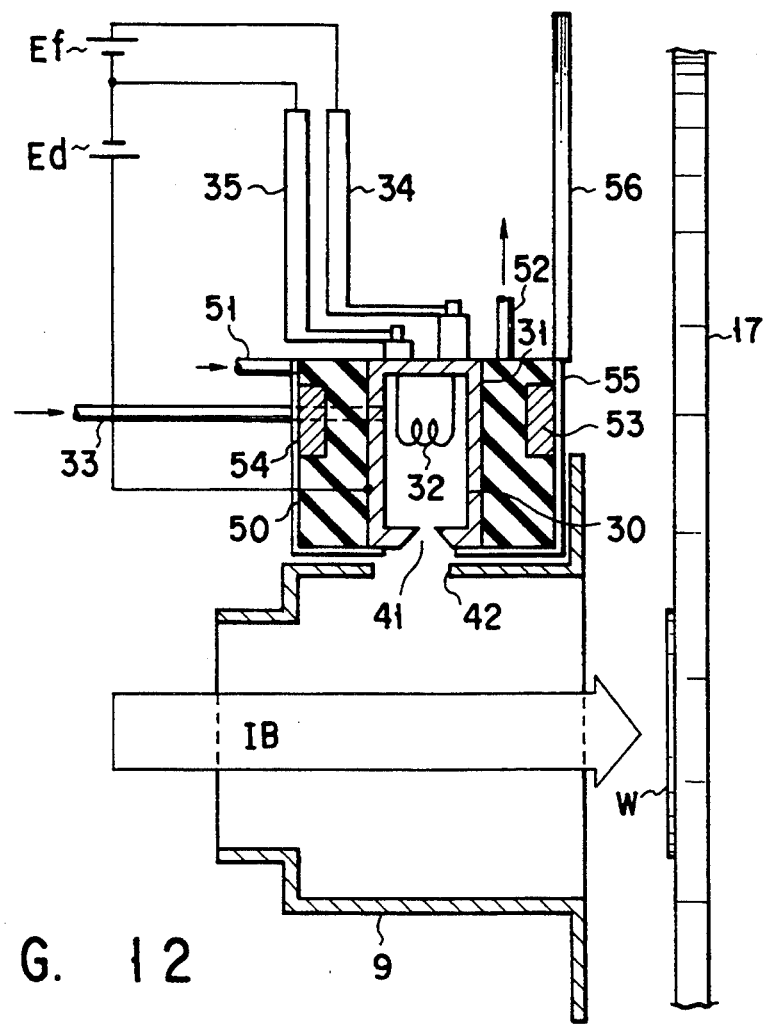
FIG. 12 is a sectional view showing a plasma generating device together with the Faraday cup, said plasma generating device serving to supply electrons to neutralize positive charges stored on the surface of a wafer when ions are implanted into the wafer.

The plasma generating chamber 31 is housed in a cooling block 50 made of aluminium, for example, as shown in FIGS. 12 and 14. A cooling water passage (not shown) is formed in the block 50 to cool the chamber 31. Cooling water pipes 51 and 52 are connected to the cooling water passage to circulate cooling water through the passage.

Permanent magnets 53 and 54 are arranged in the block 50 to oppose to each other with both side walls of the chamber 31 interposed between them. The magnets 53 and 54 are intended to make high the probability of electrons emitted from the filament 32 to collide with gas so as to efficiently generate plasma. Each of them has an N pole inside and an S pole outside.

A magnetic shield cover 55 covers the front (which faces the Faraday cup 9) and both sides of the block 50. This is because, when magnetic field is generated even in the cup 9 by the permanent magnets 53 and 54, the moving direction of electrons drawn out of the plasma generating device 30 is defined by the magnetic field to make it difficult for the electrons to be supplied to that surfaces of the wafers W where charges must be neutralized.

The power supply members 34 and 35 are arranged on the rear side (which is opposed to the Faraday cup 9) of the chamber 31. A large amount of current flows to the power supply members 34 and 35. They may, therefore, be heated to a high temperature of about 800° C., for example. When they a re heated to such high temperature, contaminating matters emitted from their surfaces may contaminate wafer surfaces and circuit patterns on them may be thermally deformed. A heat shield plate 56, therefore, is provided to shield the wafers W from the rear side area of the chamber 31, as shown in FIGS. 12 and 15. It is located to shield any of the wafers on the disk 17 from those members which are heated to high temperature.

The operation of the above-described ion implantation system will be described.

The vacuum chamber 2 and those areas in which the ion beam passage is formed are depressurized to a vacuum of $5 \times 10^{-6}$ Torr, for example.

The beam gate 19 is closed and plasma is generated from predetermined material, such as material including arsenic atoms, in the ion source device 1. Extraction voltage of 5 kV, for example, is added between the extraction electrode 11 and the ion source device 1 to draw an ion beam, in which arsenic ions, for example, are included, out of the ion source device 1.

Discharge gas such as argon is introduced into the chamber 21 of the plasma generating device 4 at a flow rate of 0.1 SCCM, for example. Filament voltage Vf of 3V, for example, and discharge voltage vd of 20–30 V, for example, are added between predetermined terminals. The discharge gas is excited by thermoelectrons emitted from the filament 21 and made into plasma. Since the ion beam IB is formed in front of the opening 24 of the chamber 21, electrons in plasma in the chamber 21 are drawn by the ion beam IB. As the result, the ion beam IB is brought under such a state that electrons and positive ions are mixed in it.

The disk 17 is started to rotate, and then the beam gate 19 is opened after plasma is ignited in the plasma generating device 4.

The ion beam to which electrons have been added passes through the variable slit 12 and then enters into the mass spectrometer 5. It is mass-spectrometrically analyzed by the mass spectrometric magnet 13 to pick up only desired ions. Further, ions whose masses are extremely alike to those of the desired ions (such as ions of particles sputtered from walls of the ion source device 1) are excluded from it. It is then accelerated by the accelerating tube 17 and implanted into the wafers W on the disk 17. While the disk 17 is rotated, it is moved in its radial direction so that ions are uniformly implanted into the wafers W.

The operation of electrons added to the ion beam will be described referring to FIGS. 6 and 7.

FIGS. 6 and 7 show distributions of charges and voltage in a cross section of the ion beam. An abscissa in each Figure shows positions from the center of the ion beam, and dot and solid curves in them represent a case where electrons are not supplied and a case where electrons are supplied, respectively. As shown in the FIGS. 6 and 7, dot curves representing distributions of charges and voltage in the ion beam to which electrons are not supplied rise sharply from both ends thereof. When electrons are supplied into the ion beam to neutralize charges, however, distributions of charges and voltage become flat as shown by solid curves. The repelling force of positive ions in the ion beam becomes small and the diverging of the ion beam can be thus suppressed.

When electrons are supplied to the ion beam, current (flowing to the Faraday cup 9) of about 10–20 mA is allowed to flow to the wafer even if extraction voltage of about 5 kV is set between the extraction electrode 11 and the body of the ion source device 1. A more efficient implanting of ions can be thus achieved. In addition, impurities can be introduced into the wafer with higher-current while making the energy of ions smaller. When impurities are to be implanted into a wafer to a small depth thereof, therefore, a more efficient ion implanting can be achieved while keeping the depth of ions implanted into the wafer more uniform.

The device for supplying electrons to the ion beam or the plasma generating device 4 can be located at any position between the ion source device 1 and the accelerating tube 7 (including the inside of the tube 7). In a case of the ion implantation system wherein the accelerating tube 7 is located upstream the mass spectrometer 5, the above-mentioned ion supply device may be located between the ion source device 1 and the mass spectrometer 5 (including the inside of the spectrometer 5).

The function of the suppressor electrode 25 comprising electrode elements 26 and 27 each having the conductive cylinder M1 and the protection film M2 will be described with reference to FIGS. 10 and 11.

Insulating film is formed on the surface of the suppressor electrode 25 (or of each of the electrode elements 26 and 27) because the surface of the wafers W is sputtered by the ion beam IB and sputtered particles are caused to fly out of the wafers and photo-resist film on the wafers W. On the other hand, positive charged particles caused when remaining gas is ionized by its collision with the ion beam IB, and those in plasma generated by the plasma generating device 30 are drawn to the suppressor electrode 25. The positive charged particles thus drawn to the suppressor electrode 25 are stored on the insulating film on the surface of the suppressor electrode 25. The ion beam IB, however, is not drawn to the suppressor electrode 25 because its speed is high.

Figures 10, 11:
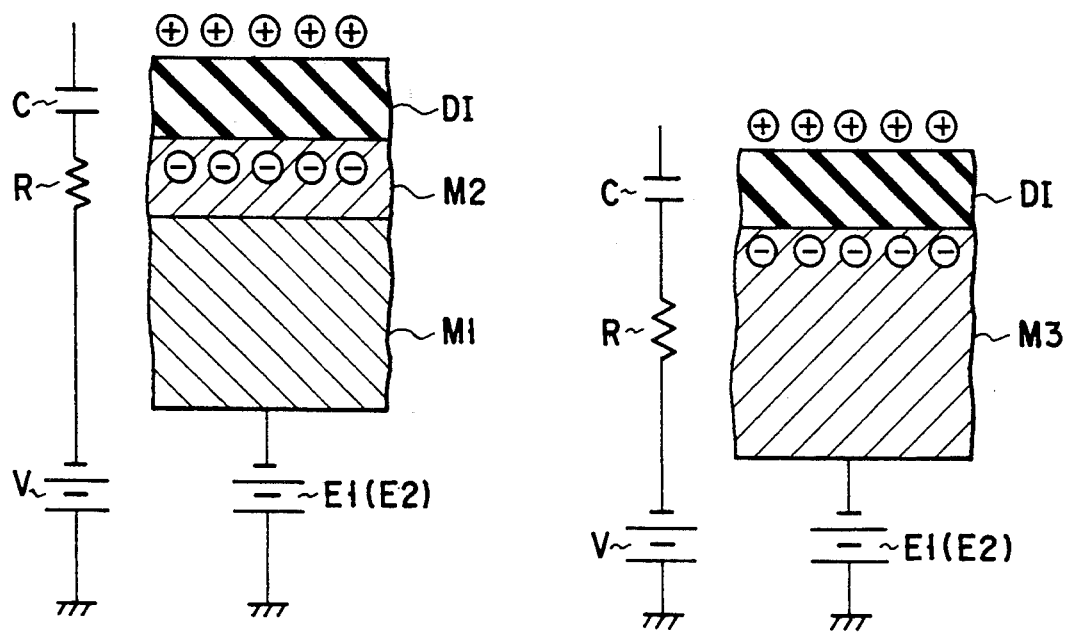
FIGS. 10 and 11 are sectional views intended to explain the operation of a suppressor electrode according to the present invention.

FIG. 10 schematically shows the above-described state of positive charged particles together with an equivalent circuit. Symbols C, R and V in FIG. 10 represent the capacity of insulating film DI, the resistance of protection film M2, and suppressing voltage, respectively.

Figure 1:
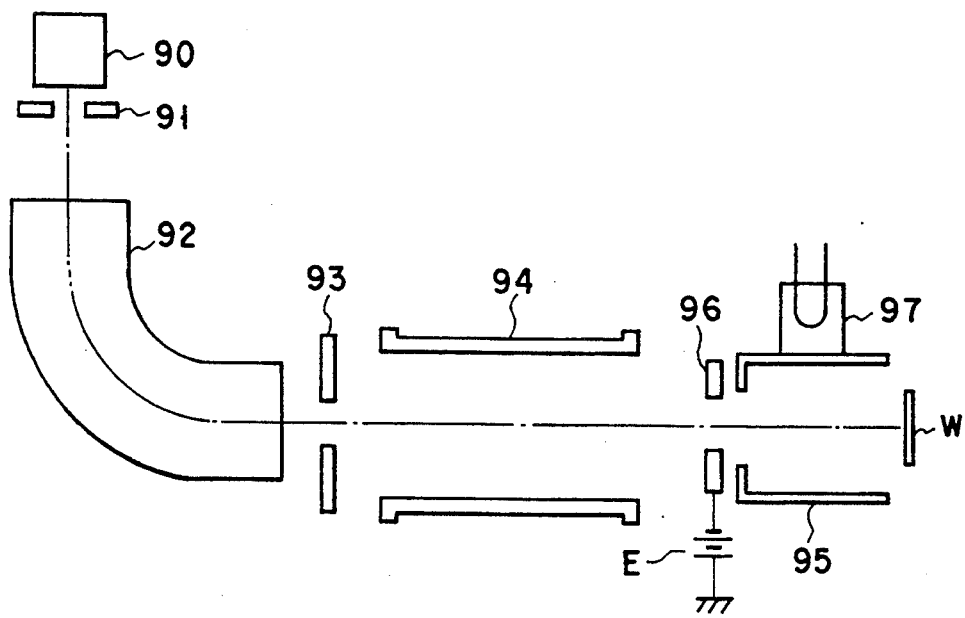
FIG. 1 schematically shows the whole of the conventional ion implantation system.
Figures 2, 3:
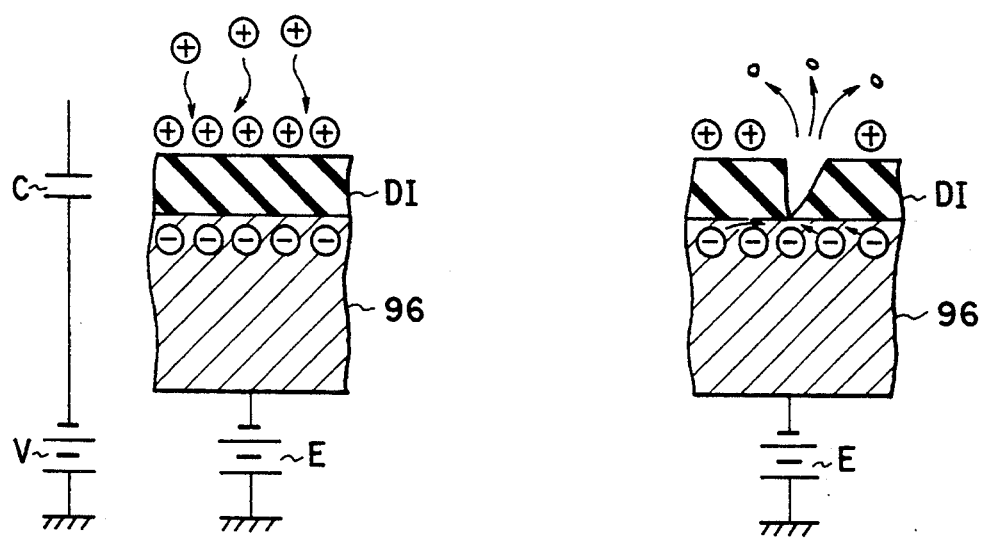
FIGS. 2 and 3 are sectional views intended to explain what a problem the conventional suppressor electrode has.

When the protection film M2 is not present as shown in FIG. 3 and the amount of positive charges stored exceeds the break down voltage of the insulating film DI, discharge is caused at that area of the insulating film DI where the amount of its pressure-resisting charges is exceeded and current is caused to rapidly flow. When the protection film M1 is provided as shown in FIG. 10, however, it is made difficult by the resistance of this protection film M1 that the discharge is caused. Even if the discharge is caused, current supplied when initial discharge is caused is limited and discharge time constant becomes long accordingly. This can prevent burst from being caused by instant temperature rise.

In order to check the effect of the protection film M2, suppressor electrodes having SiC semiconductor film on the surface of a carbon-made conductive body and having no SiC film on the surface were incorporated into the ion implantation system and used under same conditions. After they were used in this manner, their surfaces were observed through the microscope. The number of holes caused by discharge was less and the diameter of any of these holes was smaller in the case of the suppressor electrode having SiC film than in the case of the suppressor electrode having no SiC film.

Further, the number of particles having a diameter larger than 0.3 μm and adhering to the surface of 8-inch wafer W to which ions had been implanted was checked. 20–30 particles were counted in the case of the suppressor electrode having SiC film but about 60 particles in the case of the suppressor electrode having no SiC film.

The reason why this difference results is not made apparent yet. The following is supposed to be the reason. Discharge is difficultly caused by the resistance of protection film. Even if discharge is caused, the peak value of current discharged is suppressed by the resistance of protection film and instant energy is thus made small. As the result, damages added to the surface area of the suppressor electrode are suppressed.

The whole of the suppressor electrode 25 may be made of high resistant conductive matter or semiconductor such as SiC, for example. FIG. 11 shows the state of positive charges stored when the whole of the suppressor electrode is made of high resistant conductive material and the insulating film DI is further formed on the surface of the electrode. In the case where the whole of the suppressor electrode is made of high resistant conductive material, conditions under which the resistant value of this conductive material is selected must be more strictly limited than in the case where the conductive material is used as the protection film M2 on the surface of the suppressor electrode. In short, it is set in a range of $10^{-3}$ Ωcm–$10^3$ Ωcm.

It is preferable that the suppressor electrode 25 has an inner face (by which the passage of ion beam is enclosed) shaped circular. When the electrode 25 has a square-shaped inner face, for example, the number of damages added to inner corners of the electrode 25 becomes more. The following is supposed to be the reason. The ion beam is circular. When the inner face of the suppressor electrode 25 is made circular, therefore, the insulating film formed on this circular inner face of the electrode 25 is sputtered and peeled off by the ion beam, thereby making it difficult for the insulating film to be stored on it.

The technique of making the electrode by body M1 and protection film M2 or the whole of it by high resistant conductive material can be applied to such electrodes as the extraction and accelerating ones, on which insulating film can be stored as a subproduct, as well as the suppressor electrode 25.

The plasma generating device 30 intended to neutralize positive charges stored on the surfaces of the wafers W will be described referring to FIGS. 12 and 13.

When the filament 32 is heated by voltage Vf, thermions are generated. Because discharge voltage Vd is added between the filament 32 and the plasma generating chamber 31, thermions thus generated excite discharge gas such as argon introduced into the plasma generating chamber 31 through the gas supply pipe 33 to thereby make it into plasma. Magnetic field is formed in the chamber 31 by the permanent magnets 53 and 54. This enables plasma to be efficiently generated. When the surfaces of the wafers W are charged positive by the shooting of ion beam, potential gradient is caused between the chamber 31 and the surfaces of the wafers W. Electrons in the plasma are thus drawn from the chamber 31 to the surface of the wafers W to thereby neutralize positive charged on it.

The inner walls of the chamber 31 are sputtered by the plasma and carbon and molybdenum particles thus sputtered fly out into the Faraday cup 9 through the plasma outlets 41 and 42. In addition, tungsten particles fly out from the heated filament 32. The cup 9 and the process chamber 8, in which the wafers W are located, are kept under vacuum atmosphere lower than $10^{-4}$ pascals, for example. This enables the above-mentioned particles to fly out in a straight line. As shown in FIG. 13, however, the plasma outlets 41 and 42 are designed to position the wafers outside the scope defined by lines of sight through them, thereby preventing the particles from colliding directly with the surface of any wafer. This prevents the wafers from being contaminated by the particles.

The ion beam is often shot even onto that area of the disk 17 which is a little spread outside from the outer rim of the wafer located at the ion-implanting position, in order not to reduce the uniformity of impurities density at the peripheral portion of each wafer W. It is, therefore, preferable to design the plasma outlets 41 and 42 such that the area shot by the ion beam is also positioned out of the above-mentioned scope defined by lines of sight which are extended from the chamber 31 through the outlets 41 and 42. This is because the particles adhering to that area of the disk 17 which corresponds to this marginal region shot by the ion beam can be sputtered by the ion beam and again made floating particles to contaminate the surfaces of the wafers W.

It is preferable that the plasma outlets comprise a combination of the opening 41 in the front of the chamber 31 and the opening 42 formed in the member (or side wall of the Faraday cup 9 in this case) different from the chamber 31. However, it is also possible that the scope is defined by lines of sight only through the opening 41 in the front of the chamber 31.

The present invention is not limited to the above-described ion implantation system according to an embodiment of the present invention. It can also be applied to those system in which no accelerating tube 7 is provided and in which the Faraday cup 9 is located on the rear side of the rotating disk 17. It can also be applied to the device for carrying wafers one by one into the process chamber 8 as well as the system for implanting ions not to wafers but to other objects to be processed.

What is claimed is:

1. A system for implanting ions into an object to be processed in vacuum atmosphere, comprising:

support means for supporting the object;

an ion source device for generating plasma in which ions to be used are included;

means for extracting the ions, as an ion beam, from the plasma;

guide means for accelerating and shooting the ion beam to the object supported by the support means;

a Faraday cup located adjacent to the support means to enclose the object for measuring the amount of ions implanted on the basis of secondary electrons generated from the object at the time of ion implantation;

a suppressor electrode for suppressing the flow-out of the secondary electrons from the Faraday cup and having a main surface exposed to the secondary electrons and made of a high resistance conductive material whose resistance value is in a range of $10^{-2}$ Ωcm–$10^5$ Ωcm; and a power source for adding negative potential to the suppressor electrode.

2. The ion implantation system according to claim 1, wherein said suppressor electrode comprises a low resistance conductive body and a protection film formed on the body to serve as a main surface of said suppressor electrode, and said protection film is made of said high resistance conductive material.

3. The ion implantation system according to claim 1, wherein the whole of said suppressor electrode is made of said high resistance conductive material and the resistance value of said material is in a range of $10^{-3}$ $\Omega$cm–$10^3$ $\Omega$cm.

4. The ion implantation system according to claim 1, wherein said high resistance conductive material comprises semiconductor.

5. The ion implantation system according to claim 4, wherein said high resistance conductive material is SiC.

6. The ion implantation system according to claim 1, wherein said high resistance conductive material comprises conductive ceramics.

7. The ion implantation system according to claim 1, wherein said support means, Faraday cup and suppressor electrode are arranged in a same vacuum process chamber.

8. The ion implantation system according to claim 7, wherein said Faraday cup is arranged between said guide and support means, said suppressor electrode is arranged between said guide means and the Faraday cup, and said suppressor electrode has a circular opening through which the ion beam passes and which is defined by the main surface of the suppressor electrode.

9. The ion implantation system according to claim 1, wherein said guide means includes a mass spectrometer located on the side of said ion source device and accelerating means located on the side of said support means.

10. The ion implantation system according to claim 1, wherein electron supply means is arranged between said ion source device and said guide means to supply electrons to the ion beam and neutralize charges in it.

11. The ion implantation system according to claim 10, wherein said electron supply means is a plasma generating device.

12. The ion implantation system according to claim 1, wherein a plasma generating device is connected to said Faraday cup to supply electrons so as to neutralize positive charges stored on the surface of said object at the time of ion implantation, said plasma generating device includes a plasma generating chamber communicated with said Faraday cup through an opening, and said opening of the plasma generating chamber is designed such that the object is not present in a scope defined by lines of sight spreading outside from the plasma generating chamber through said opening.

13. A system for implanting ions into an object to be process in vacuum atmosphere, comprising:
   support means for supporting the object;
   an ion source device for generating plasma in which ions to be used are included;
   means for drawing out the ions, as an ion beam, from the plasma;
   guide means for accelerating and shooting the ion beam to the object supported by the support means;
   electron supply means arranged between the ion source device and the guide means to supply electrons to the ion beam so as to neutralize charges in it;
   a Faraday cup located adjacent to the support means to enclose the object for measuring the amount of ions implanted on the basis of secondary electrons generated from the object at the time of ion implantation;
   a suppressor electrode for suppressing the flow-out of the secondary electrons from the Faraday cup and having a main surface exposed to the secondary electrons and made of a high resistance conductive material whose resistance value is in a range of $10^{-2}$ $\Omega$cm–$10^5$ $\Omega$cm;
   a power source for adding negative potential to the suppressor electrode.

14. The ion implantation system according to claim 13, wherein said electron supply means is a plasma generating device.

15. The ion implantation system according to claim 14, wherein said ion source and plasma generating devices are arranged in a same vacuum chamber.

16. The ion implantation system according to claim 5, wherein said plasma generating device includes a plasma generating chamber provided with an opening through which discharge gas is introduced into the plasma generating chamber, and a filament arranged in the plasma generating chamber.

17. A system for implanting ions into an object to be processed in vacuum atmosphere, comprising:
   support means for supporting the object to be process;
   an ion source device for generating plasma in which ions to be used are included;
   means for extracting the ions, as an ion beam, from the plasma;
   guide means for accelerating and shooting the ion beam to the object supported by the support means;
   a Faraday cup located adjacent to the support means to enclose the object for measuring the amount of ions implanted on the basis of secondary electrons generated from the object at the time of ion implantation;
   a suppressor electrode for suppressing the flow-out of the secondary electrons from the Faraday cup and having a main surface exposed to the secondary electrons and made of a high resistance conductive material whose resistance value is in a range of $10^{-2}$ $\Omega$cm–$10^5$ $\Omega$cm;
   a power source for adding negative potential to the suppressor electrode; and
   a plasma generating device connected to the Faraday cup to supply electrons so as to neutralize positive charges stored on the surface of the object at the time of ion implantation, and having a plasma generating chamber communicated with the Faraday cup through an opening, which is designed such that the object is not present in a scope defined by lines of sight spreading outside from the plasma generating chamber through the opening.

18. The ion implantation system according to claim 17, wherein said support means, Faraday cup, suppressor electrode and plasma generating device are arranged in a same vacuum chamber.

19. The ion implantation system according to claim 18, wherein said plasma generating chamber is covered by a block which has cooling means.

* * * * *